US008782573B2

(12) United States Patent
Agarwal et al.

(10) Patent No.: US 8,782,573 B2
(45) Date of Patent: Jul. 15, 2014

(54) SOLUTIONS FOR RETARGETING INTEGRATED CIRCUIT LAYOUTS BASED ON DIFFRACTION PATTERN ANALYSIS

(75) Inventors: Kanak B. Agarwal, Austin, TX (US); Shayak Banerjee, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/600,319

(22) Filed: Aug. 31, 2012

(65) Prior Publication Data

US 2014/0068529 A1    Mar. 6, 2014

(51) Int. Cl.
*G06F 17/50*    (2006.01)

(52) U.S. Cl.
USPC ............................. 716/54; 716/51; 716/55

(58) Field of Classification Search
None
See application file for complete search history.

(56) References Cited

U.S. PATENT DOCUMENTS

| 8,146,026 | B2 * | 3/2012 | Agarwal et al. ................. 716/56 |
| 2010/0333049 | A1 | 12/2010 | Agarwal et al. |
| 2011/0091815 | A1 | 4/2011 | Dunn et al. |
| 2011/0119642 | A1 * | 5/2011 | Agarwal et al. ................. 716/50 |
| 2011/0271239 | A1 | 11/2011 | Lu et al. |
| 2012/0075603 | A1 | 3/2012 | Hansen et al. |

OTHER PUBLICATIONS

Yang et al., "Model-Based Retarget for 45nm Node and Beyond", Proceedings of SPIE, vol. 7274, 727428-1, 2009, 8 pages.
Kobayashi et al., "Automated Hot-Spot Fixing System Applied to the Metal Layers of 65nm Logic Devices", Journal of Micro/Nanolithography, MEMS, and MOEMS, vol. 6, No. 3, Jul. 1, 2007, 031010, 6 pages.
Banerjee et al, "SMATO: Simultaneous Mask and Target Optimization for Improving Lithographic Process Window", Proceedings of International Conference on Computer-Aided Design (ICCAD), 2012.
Agarwal et al, "Integrated Model-Based Retargeting and Optical Proximity Correction", Proceedings of SPIE Advanced Lithography, vol. 7974, 2011, 79740F, 10 pages.
Banerjee et al., "Electrically-Driven Retargeting for Nanoscale Layouts", Proceedings of Custom Integrated Circuits Conference (CICC), Sep. 19-21, 2011, 4 pages.
Rosenbluth et al., "Optimum Mask and Source Patterns to Print a Given Shape", Journal of Micro/Nanolithography, MEMS, and MOEMS, vol. 1, No. 1, 2002, pp. 13-30.
Tseng et al., "Process Capability Comparison Between LELE DPT and spacer for NAND Flash 32nm and Below", Proc. SPIE, vol. 7140, 2008, 714035, 11 pages.
Wuu et al, Detecting Context Sensitive Hot Spots in Standard Cell Libraries, Proc. SPIE, vol. 7275, 2009, 727515, 9 pages.
Yeung et al., "Fast and Rigorous Three-Dimensional Mask Diffraction Simulation Using Battle-Lemarie Wavelet-Based Multi-Resolution Time-Domain Method", Proc. SPIE, vol. 5040, 2003, pp. 69-77.

* cited by examiner

*Primary Examiner* — A. M. Thompson
(74) *Attorney, Agent, or Firm* — Yuanmin Cai; Hoffman Warnick LLC

(57) ABSTRACT

A computer-implemented method for retargeting an Integrated Circuit (IC) layout is disclosed. In one embodiment, the method includes generating a diffraction pattern for the IC layout including a set of diffraction-orders, the IC layout including a set of features defined by a set of target edges, analyzing the diffraction pattern with a merit function to estimate printability of the IC layout, monitoring a change in value of the merit function as a position of at least one of the set of target edges is adjusted across a range, and retargeting the set of target edges based on the monitoring of the merit function.

20 Claims, 7 Drawing Sheets

US 8,782,573 B2

SOLUTIONS FOR RETARGETING INTEGRATED CIRCUIT LAYOUTS BASED ON DIFFRACTION PATTERN ANALYSIS

BACKGROUND

The subject matter disclosed herein relates to solutions for retargeting of integrated circuit layouts. More specifically, the subject matter disclosed herein relates to diffraction pattern optimization-based retargeting of integrated circuit layouts for improved printability.

As technology has advanced, devices and features on integrated circuits have shrunk to a size which may be extremely vulnerable to printing tolerances and clearances. Due to a lack of advanced lithographic technologies, printing of these features may be difficult as dimensions of these features may be a fraction of the wavelength of light which is being used for imaging. These limitations require that in the design and manufacture of integrated circuit devices, designers must account for attribute and dimensional variations which result from manufacturing processes (e.g., lithography, processing, etc.) and printability limitations. Devices and features which in the ideal/conceptual design are intended to have specific shapes, angles, widths, and borders, may, when actually manufactured on a chip, have variations in critical dimensions or electrical characteristics as a result of the limits of manufacturing processes and the relative positions of the devices and features on the chip. While the shape intended by the designer may meet the design rules for a given chip conceptually, the variations introduced by the printing process may lead to 'hot spots' (e.g., device overlap), poor performance, inefficiencies, and even failures.

Identifying and/or eliminating every troublesome construct during the design phase of the integrated circuit process, significantly increases the volume of design rules, and consequently the design overhead in terms of time and effort. Conventional approaches for limiting and/or anticipating and avoiding these manufacturing variations includes retargeting (e.g., modifying designer-drawn target shapes prior to preparing lithographic masks) of feature shapes. Some approaches for retargeting have included rule-based retargeting (e.g., a set of design rules which anticipate troublesome constructs), and/or mask and target optimization processes which simulate and adjust designs based on computer simulations. However, rule-based approaches cannot cover all possible two-dimensional layout configurations and hence fail to adequately account for all of the possible feature/device shapes. Further, simulation-based methods are computationally intensive, failing to efficiently and quickly produce a workable design.

BRIEF SUMMARY

A computer-implemented method of retargeting an integrated circuit (IC) layout is disclosed. In one embodiment, the method includes: generating a diffraction pattern for the IC layout including a set of diffraction orders, the IC layout including a set of features defined by a set of target edges; analyzing the diffraction pattern with a merit function to estimate printability of the IC layout; monitoring a change in value of the merit function as a position of at least one of the set of target edges is adjusted across a range; and retargeting the set of target edges based on the monitoring of the merit function.

A first aspect includes a computer-implemented method for retargeting an integrated circuit (IC) layout, the method including: generating a diffraction pattern for the IC layout including a set of diffraction orders, the IC layout including a set of features defined by a set of target edges; analyzing the diffraction pattern with a merit function to estimate printability of the IC layout; monitoring a change in value of the merit function as a position of at least one of the set of target edges is adjusted across a range; and retargeting the set of target edges based on the monitoring of the merit function.

A second aspect includes a computer system having: at least one computing device configured to retarget an integrated circuit (IC) layout by performing actions including: generating a diffraction pattern for the IC layout including a set of diffraction orders, the IC layout including a set of features defined by a set of target edges; analyzing the diffraction pattern with a merit function as a position of at least one of the set of target edges is adjusted across a range; and retargeting the set of target edges based on the diffraction pattern analysis.

A third aspect includes a computer program product comprising program code embodied in at least one computer-readable storage medium, which when executed, enables a computer system to retarget an integrated circuit (IC) layout by performing actions including: generating a diffraction pattern for the IC layout including a set of diffraction orders, the IC layout including a set of features defined by a set of target edges; analyzing the diffraction pattern with a merit function to estimate printability of the IC layout; monitoring a change in value of the merit function as a position of at least one of the set of target edges is adjusted across a range; and retargeting the set of target edges based on the monitoring of the merit function.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
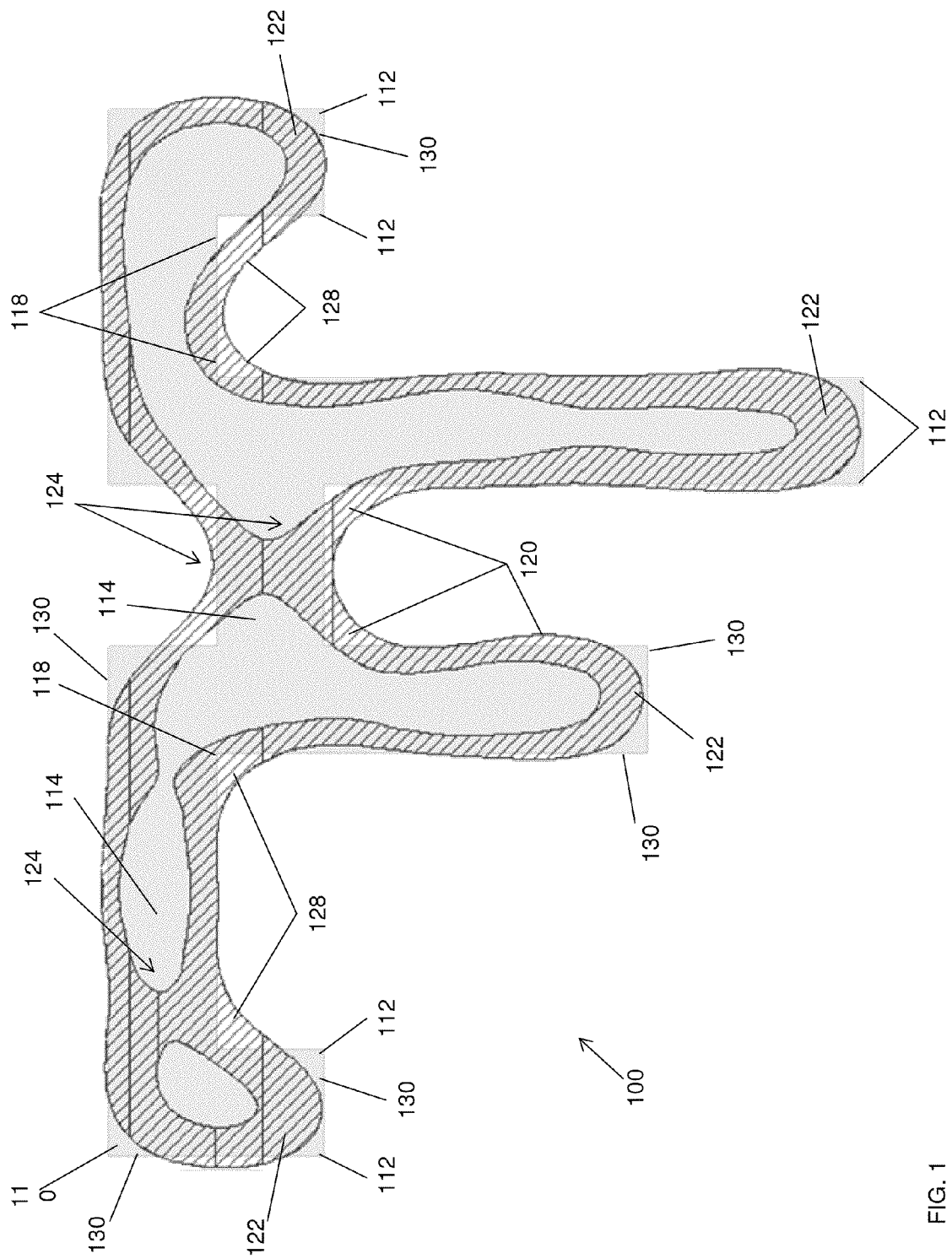
FIG. 1 is a demonstrative illustration of a portion of an integrated circuit (IC) design layout according to an embodiment.

It is noted that the drawings of the disclosure are not necessarily to scale. The drawings are intended to depict only typical aspects of the disclosure, and therefore should not be considered as limiting the scope of the disclosure. It is understood that elements similarly numbered between the FIG- URES may be substantially similar as described with reference to one another. Further, in embodiments shown and described with reference to FIGS. 1-8, like numbering may represent like elements. Redundant explanation of these elements has been omitted for clarity. Finally, it is understood that the components of FIGS. 1-8 and their accompanying descriptions may be applied to any embodiment described herein.

DETAILED DESCRIPTION

As noted, the subject matter disclosed herein relates to solutions for retargeting integrated circuit (IC) layouts. More specifically, the subject matter disclosed herein relates to methods and systems for generating a diffraction pattern from an IC layout, and analyzing the diffraction pattern with a merit function to adjust feature edges of the IC layout to improve design and manufacture of the integrated circuit.

As integrated circuit technologies shrink in size along with advancements in technology, variations in device dimensions and electrical characteristics can impact the performance of those integrated circuits significantly. Limitations imposed by printing/manufacturing processes may result in the development of hot spots, overlaps, and inefficient features in the physical IC, which in the conceptual design were not present. Predicting, detecting, and avoiding these occurrences through retargeting of the IC layout prior to manufacturing may, improve IC quality, reliability, and manufacturing processes.

Traditionally, IC layouts are made up of a large number of polygons, each of which is referred to as a "feature." Conventional approaches for retargeting target edges of features in an IC layout to avoid troublesome constructs include: rule-based retargeting of feature edges, and/or model-based retargeting of feature edges. However, these approaches fail to produce timely (e.g., model-based retargeting may be very computationally intensive and time consuming) and/or comprehensive (e.g., rule-based retargeting may be limited to specific shapes and configurations which were anticipated/considered/programmed by designers) retargeting and optimizations of the IC layout, leading to inaccurate models, the development of 'hot spots' and overdesigning of the IC.

In contrast to these conventional approaches, aspects of the invention include generating and analyzing a diffraction pattern for a given IC layout which includes a set of diffraction orders. These diffraction orders may contain frequency domain information about the layout, and thus may be indicative of IC printability. The IC layout may include a set of features defined by a set of target edges which may be adjusted and/or optimized by analyzing the diffraction pattern using a merit function and retargeting the target edges based on a correlation between a value of the merit function and the position of at least one of the set of target edges. For example, an IC layout may be processed through a Fourier transform to generate a diffraction pattern which is representative/related to the IC layout. A merit function may be applied to the diffraction pattern to evaluate a position of features/target edges within the IC layout relative one another as concerns the manufacturing process. The merit function may then be monitored as a position of at least one of the edges is adjusted across a range, and the IC layout may be retargeted based on the obtained values for the merit function.

In one aspect, a computer-implemented method is disclosed including the following processes:

(A) generating a diffraction pattern for the IC layout including a set of diffraction orders, the IC layout including a set of features defined by a set of target edges;

(B) analyzing the diffraction pattern with a merit function to estimate printability of the IC layout;

(C) monitoring a change in value of the merit function as a position of at least one of the set of target edges is adjusted across a range; and (D) retargeting the set of target edges based on the monitoring of the merit function.

In one embodiment, the IC layout may be improved, substantially maximized, and/or optimized by performing a greedy optimization on the merit function with respect to the diffraction pattern.

Turning to FIG. 1, a demonstrative illustration of a portion of an integrated circuit (IC) design layout 100 is shown with a design feature 110 (e.g., a conceptualized/ideal feature intended by a designer) beneath a manufactured IC feature 120. Design feature 110 is intended to have critical dimensions/shapes specified by a designer/in the integrated circuit design. Manufactured IC feature 120 is based on/created from design feature 110 in accordance with known methods and limitations, and is intended to have critical dimensions identical and/or substantially similar to design feature 110. As shown, IC design feature 110 includes a set of corners 112, a set of junctions 118, and a set of narrow necks 114, which are defined by a set of target edges 130. As can be seen, in IC design feature 110, target edges 130 are clearly defined, straight, and distinct relative one another with precise/exact dimensions, angles, and relationships. However, variations in these dimensions may develop during processing as a result of manufacturing processes and/or printability limitations, resulting in dimensions and locations of portions of manufactured IC feature 120 which may fail to directly coincide with the intent of the designer (e.g., the shape, spacing, dimensions, and/or size of IC design feature 110). In some instances, these variations may produce a set of hot spots 124 in set of narrow necks 114. Further, a set of corners 122 in manufactured IC feature 120 may be substantially rounded (e.g., failing to extend to and/or conform with set of corners 112 of design feature 110), and a set of junctions 128 may extend beyond/cover intended set of junctions 118. Hot spots 124, rounded corners 122, and/or set of junctions 128 may form undesirable shapes and features which may inhibit and/or render inoperable IC design layout 100.

Figure 2:
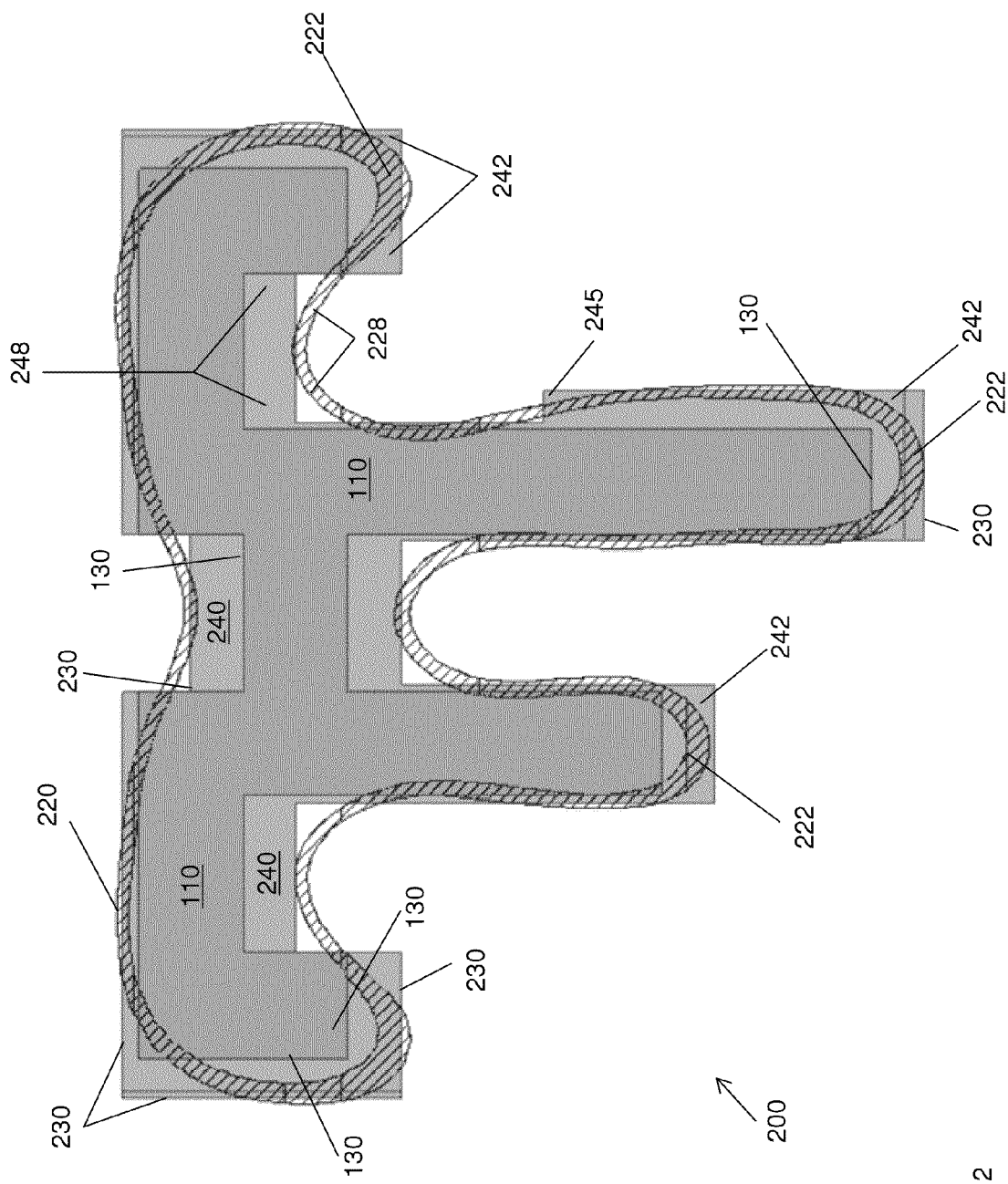
FIG. 2 is a demonstrative illustration of a portion of an integrated circuit (IC) design layout according to an embodiment.

Turning to FIG. 2 a demonstrative illustration of a portion of an integrated circuit (IC) design layout 200 is shown with a design feature 110 (e.g., a conceptualized/ideal feature intended by a designer) overlaid upon a retargeted design feature 240 in accordance with embodiments. A manufactured IC feature 220 which is manufactured based on retargeted design feature 240, is overlaid upon design feature 110 and retargeted design feature 240 in accordance with embodiments. In this embodiment, set of first target edges 130 of design feature 110 have been retargeted/adjusted to form a set of second target edges 230 defining retargeted design feature 240 in accordance with embodiments of the invention. Adjustment of set of first target edges 130 to set of second target edges 230 accentuates features of design feature 110 (e.g., set of corners 112, set of junctions 118, set of narrow necks 114, etc.) so as to improve (e.g., make more consistent with the design intent) manufactured IC feature 220. As can be seen, target edges in design feature 110, may be retargeted/adjusted in anticipation of manufacturing so as to produce a feature (e.g., manufactured IC feature 220) which more closely matches the intent/design characteristics of design feature 110. As can be seen, adjustment of set of first target edges 130 to set of second target edges 230 may reduce necking and improve characteristics of manufactured IC feature 220, thereby producing a feature which is substantially free of hot spots and is dimensionally closer to the desired design/result/intent.

Figure 3:
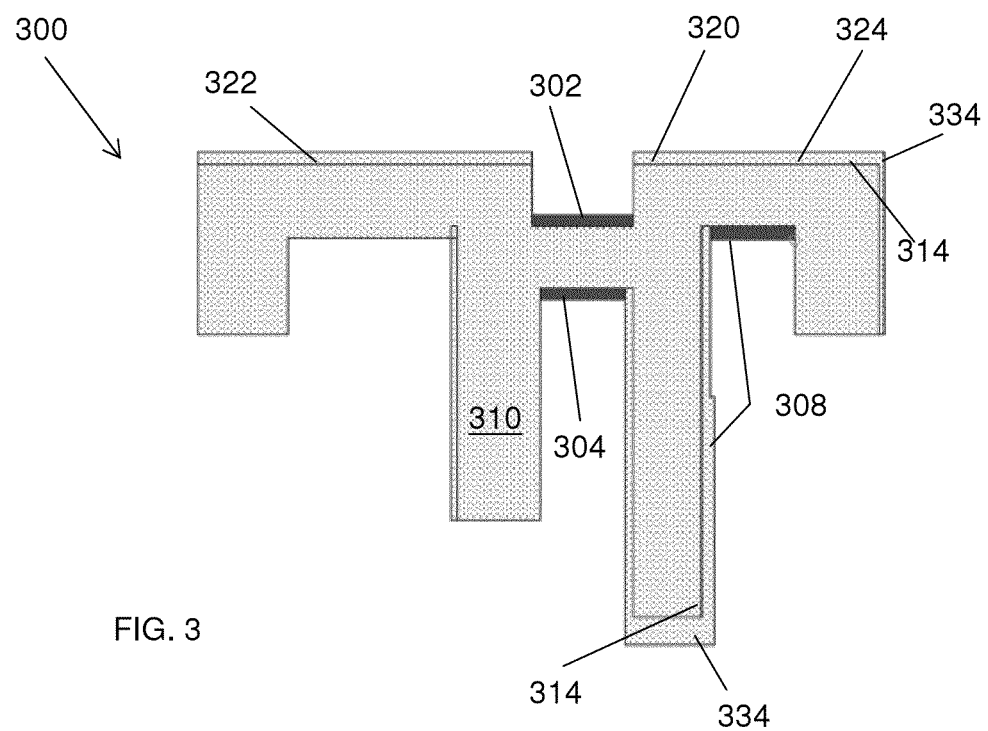
FIG. 3 is a demonstrative illustration of a portion of an integrated circuit (IC) design layout according to an embodiment.
Figure 4:
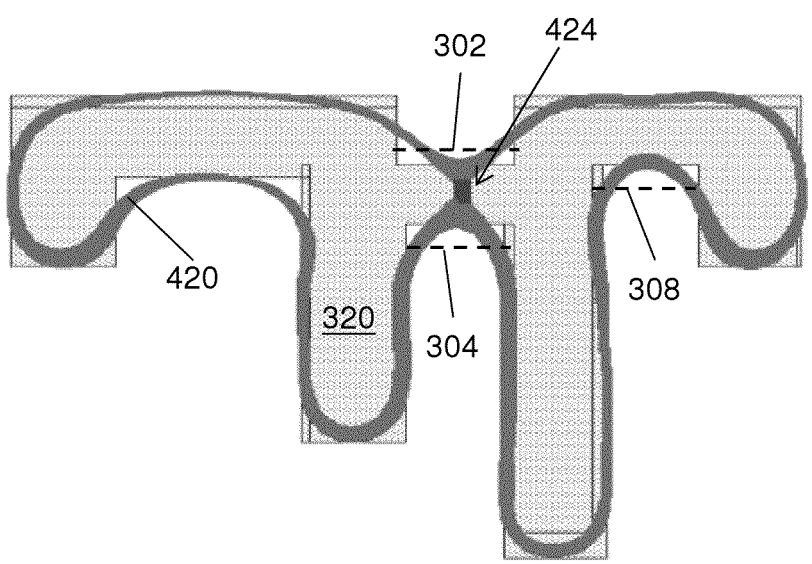
FIG. 4 is a demonstrative illustration of a portion of an integrated circuit (IC) design layout according to an embodiment.

FIG. 3 is a demonstrative illustration of an IC design layout 300 which includes a design layout 310 (shown in phantom) overlaid on a retargeted design layout 320. In this embodiment, a first set of target edges 314 have been retargeted/adjusted to a second set of target edges 334 which redefine design layout 310 and form retargeted layout 320. Adjustment of first set of target edges 314 creates set of portions 322, 324, 302, 304, and 308, which accentuate portions of design feature 310 to avoid necking and limit manufacturing failures. As can be seen in FIG. 4, a manufactured feature 420 based on design feature 310 may include a necked portion 424 which develops a hot spot/limits feature effectiveness and may be avoided by retargeting/adjusting first set of target edges 314 to form portions 302, 304, and 308 (shown in phantom), thereby defining retargeted design feature 320.

Figure 5:
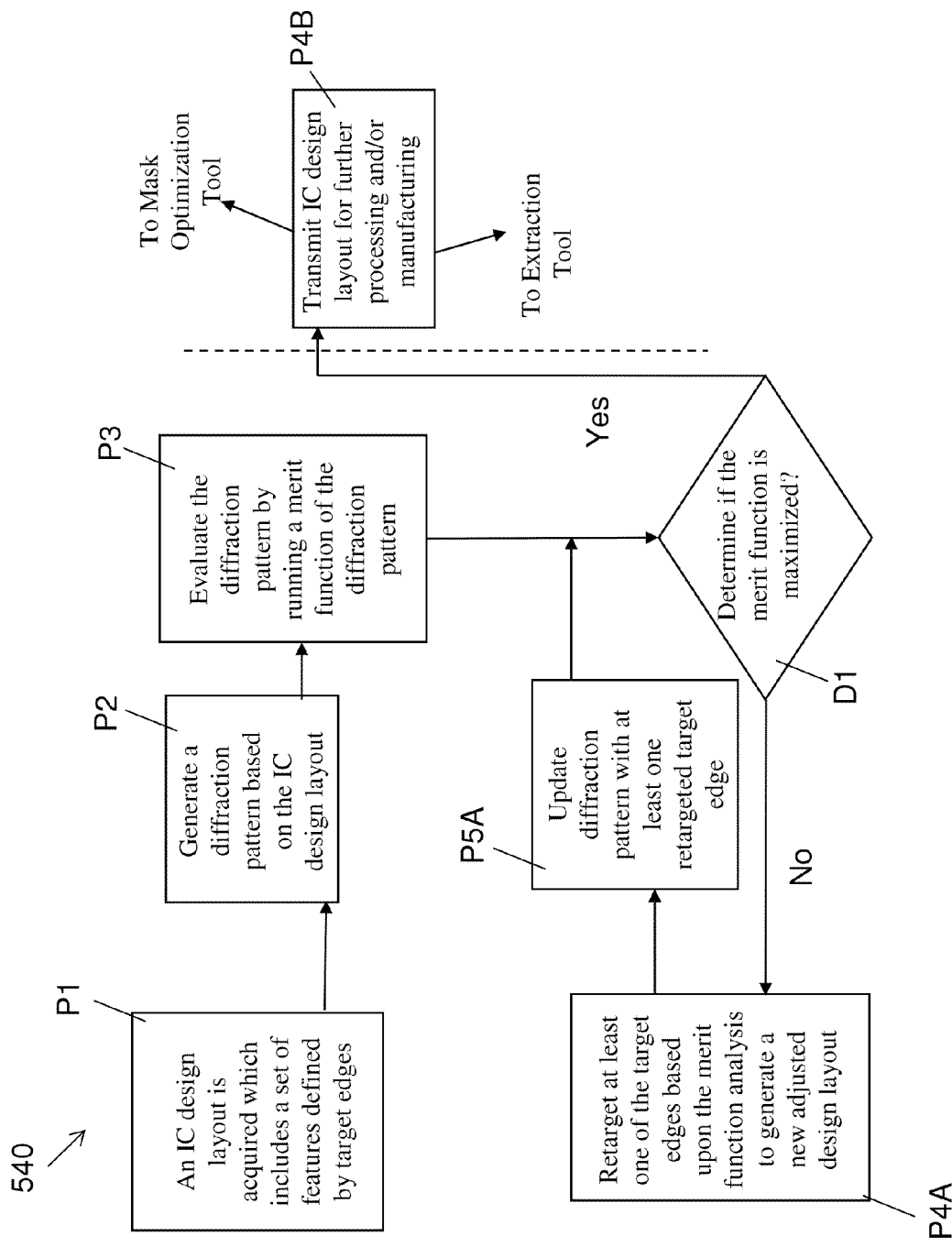
FIG. 5 shows a demonstrative illustration of a method flow diagram illustrating steps in a method of retargeting an integrated circuit (IC) layout in accordance with an embodiment.

Turning to FIG. 5, a demonstrative illustration of a method flow diagram 540 is shown illustrating a process according to aspects of the invention. In this embodiment, method flow diagram 540 illustrates processes in a method for retargeting a set of target edges for features in an IC layout, by running an analysis/optimization on a merit function of a diffraction pattern representative of the IC layout. In process P1, an IC design layout is acquired which includes a set of features which are defined by a set of target edges. Following process P1, in process P2, a diffraction pattern is generated based on the IC design layout. In one embodiment, the diffraction pattern may be generated by taking a Fourier transform of the IC design layout and/or a feature thereon. In one embodiment, the diffraction pattern may be generated from the IC design layout using a two dimensional Fourier transform similar to equation (1) below:

$$F(u,v) = \iint_{-\infty}^{\infty} f(x,y) e^{-j2\pi(ux+vy)} dx dy \quad (1)$$

Equation (1) may contain information about various dimensions and spacings of features/polygons (x,y) in the IC design layout. In an embodiment, these values may be encoded in frequency space (u,v). In one embodiment, equation (1) may be generalizable to a one dimensional IC layout by assuming the other dimension is a constant. In another embodiment, where a two-dimensional IC design layout has been obtained, a two-dimensional Fourier transform may be taken to produce the diffraction pattern. In another embodiment, a two-dimensional IC design layout may be divided into a set of one-dimensional layouts for processing/analysis in accordance with methods and systems described herein. Following process P2, in process P3, the diffraction pattern is analyzed by running a merit function of the diffraction pattern, where the merit function includes an associated equation (e.g., (2) or (3) illustrated and described herein, etc.), and a set of diffraction orders. Diffraction orders may contain information about the various spatial frequencies contained in the layout, and determine which layouts can be printed and which cannot. In one embodiment, the merit function may include variables/factors for systematic variation (e.g., areas with high density PC, PC pitch, etc.). In another embodiment, the merit function may include a set of terms which account for systematic variation factors and/or effects, these terms based on layout information, polysilicon density, active area, etc. In any event, these factors account for variations from deterministic effects on the printability of devices. In one embodiment, a form of the merit function may be dependent on the source (e.g., the specific design IC layout).

Following process P3, at decision D1, it is determined whether or not the merit function has been maximized. If at decision D1, it is determined that the merit function has not been substantially maximized, then at process P4A, at least one of the set of target edges is retargeted. In one embodiment, a new target edge may be retargeted by maximizing the merit function for the new target edge. In an embodiment, a change in the diffraction pattern may be derived analytically and/or numerically, or may be monitored as the target is moved about the design IC layout. In one embodiment, this monitoring may include processing of the merit function with a greedy search and/or optimization algorithm as described herein. As the new target edge is adjusted across a range of values, a maximized value for the merit function may be determined, and the position of the new target edge which correlates with this maximized value for the merit function may be selected as the retargeted location for the new target edge. Following process P4A, in process P5A, the diffraction pattern (e.g., values and diffraction orders therein) may be updated with the at least one retargeted target edge. In one embodiment, this change/movement of a target edge in the diffraction pattern may be calculated using a fast linear transformation (e.g., equation (3) below, etc.). Following process P5A, in D1 the updated merit function may be analyzed to determine if the updated merit function is maximized. However, if at decision D1 it is determined that the merit function has been substantially maximized, then at process P4B, the retargeted design layout may be passed on for further processing (e.g., to extraction tool, to mask optimization tool, etc.).

Figure 6:
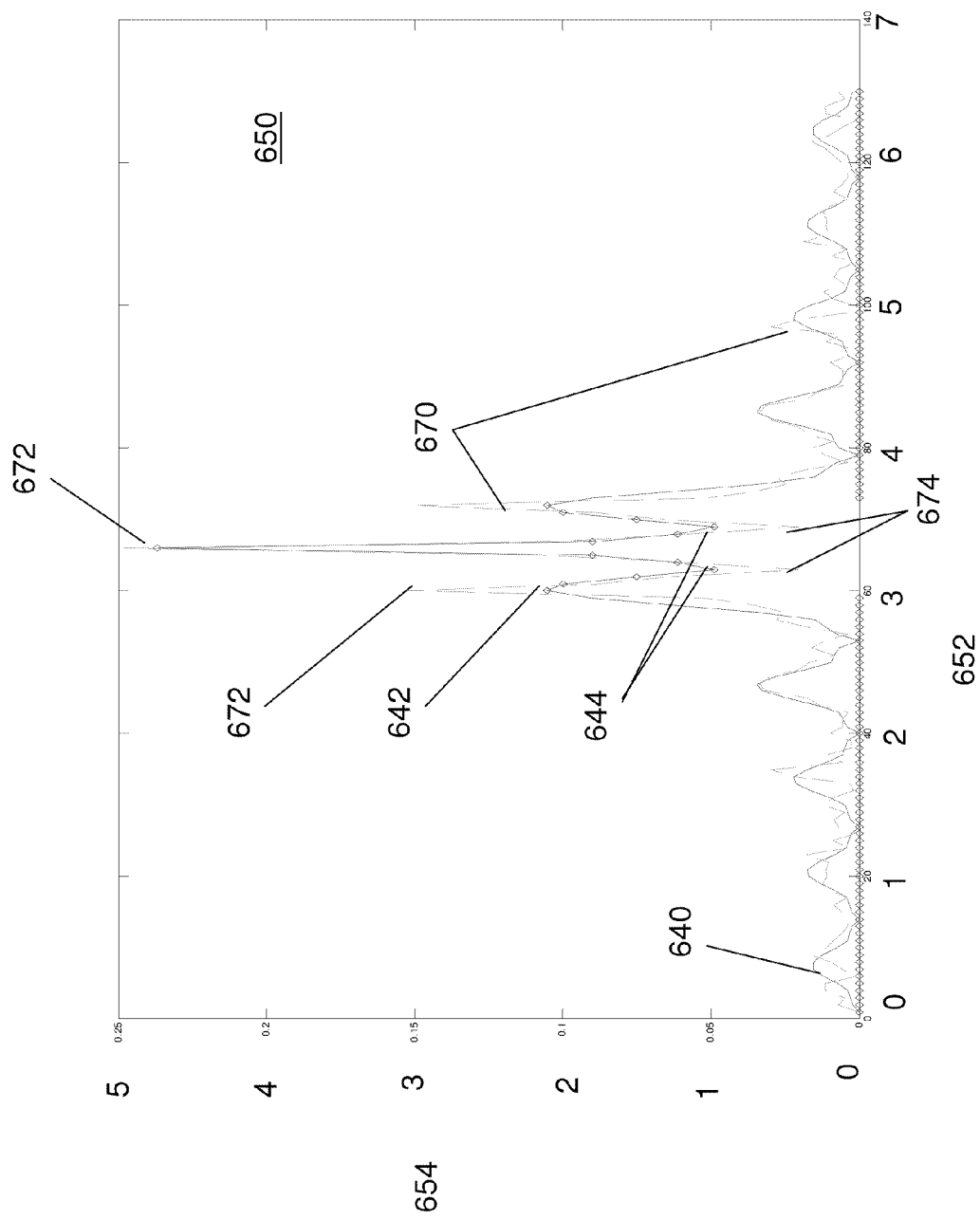
FIG. 6 is a demonstrative illustration of a chart representing retargeting an integrated circuit (IC) layout according to an embodiment.

Turning to FIG. 6, a demonstrative illustration of a graphical representation 650 of an embodiment of a diffraction pattern 640 is shown. Graphical representation 650 includes an x-axis 652 representing incremental frequencies in the IC layout (e.g., normalized), and a y-axis 654 representing magnitudes of diffraction orders at the various frequencies in the IC layout. In an embodiment, a retargeted diffraction pattern 670 (shown in phantom) is overlaid on diffraction pattern 640 and/or graphical representation 650. Diffraction pattern 640 may include a first set of peaks 642 and a first set of troughs 644 which represent relative/regional low and high points for diffraction pattern 640. In this embodiment, retargeting of the IC design layout may include retargeting to increase a differential between first set of peaks 642 and first set of troughs 644 to generate a second set of peaks 672 and a second set of troughs 674 in retargeted diffraction pattern 670. These increased variances in peak and trough values improving printability and/or manufacturing processes for the design IC layout. In one embodiment, the merit function may include equation (2) below:

$$C_{DPOR}|_{coherent} = \sum_{i=1}^{m} \left[ \frac{w_1}{|F(0)|} \left| F\left(\frac{N}{p_{x,i}}\right) - F\left(\frac{N}{p_{x,i}} - 1\right) \right| + w_2 \left| F\left(\frac{N}{p_{x,i}}\right) \right| \right] \quad (2)$$

In equation (2), N represents the size of the pattern in terms of number of pixels, F represents the diffraction pattern, C represents the merit function, m represents the total number of pitches in the design IC layout, w represents different weights on the different portions of the merit function, and $p_i$ represents the $i^{th}$ pitch in the layout. In this embodiment, the merit function including equation (1), is a merit function which maximizes both magnitude and overlap area of first diffraction orders in diffraction pattern F. In one embodiment, to maximize the merit function, an optimization algorithm may process the merit function for a given target, the optimization algorithm including equation (3) below:

$$\Delta F\left(\frac{N}{p_{x,i}}\right) = \sum_{x=1}^{N} \Delta t(x) \exp\left[-\frac{2\pi}{N} J\left(\frac{N}{p_{x,i}} x\right)\right] \quad (3)$$

In equation (3), $\Delta F$ represents the change in the diffraction pattern, x represents a spatial location of an edge, and $\Delta t$ represents target movement/change in target position. In this embodiment, the merit function may be maximized by performing a greedy search (e.g., an algorithm that follows a problem solving heuristic of making a locally optimal choice at each stage) on the merit function and analytically deriving the change in diffraction pattern by computing the linear equation (3). In one embodiment, it may be assumed that proper retargeting-type segmentation of edges has been performed apriori and that retargeting limits are specified. A computer system and/or designer may select movement of the target which maximizes the merit function. This process may be repeated for each target edge in the design IC layout.

Figure 7:
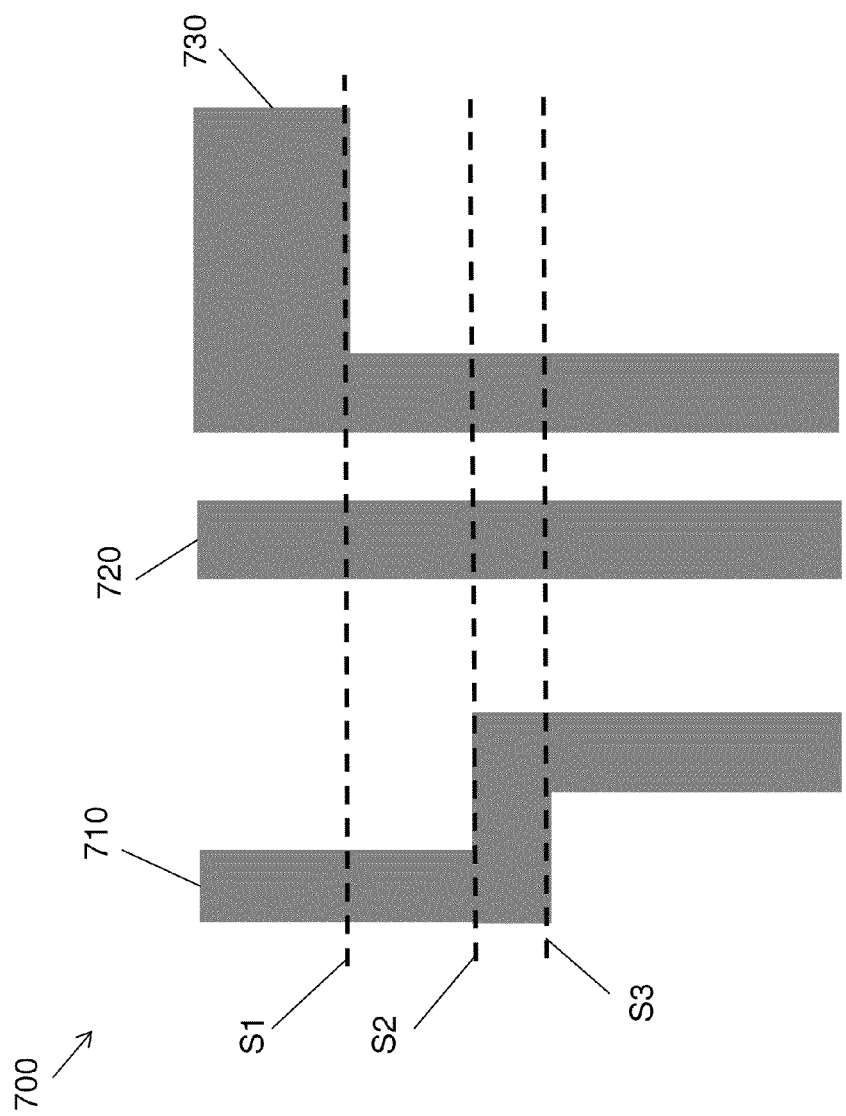
FIG. 7 is a demonstrative illustration of a portion of an integrated circuit (IC) design layout according to an embodiment.

FIG. 7 is a demonstrative illustration of a two-dimensional IC design layout 700 which includes a first feature 710, a second feature 720, and a third feature 730. In this embodiment, design layout 700 may be separated into a set of one-dimensional IC design layouts by a first slice S1, a second slice S2, and a third slice S3. First slice S1, second slice S2, and third slice S3 are representative of the target edges for first feature 710, second feature 720, and third feature 730, and may be easily converted into a set of diffraction patterns for retargeting. In one embodiment, two-dimensional IC design layout 700 may be retargeted by processing each one-dimensional IC design layout in the set of one-dimensional IC layouts. Further, each of these one-dimensional layouts may be processed in parallel.

Figure 8:
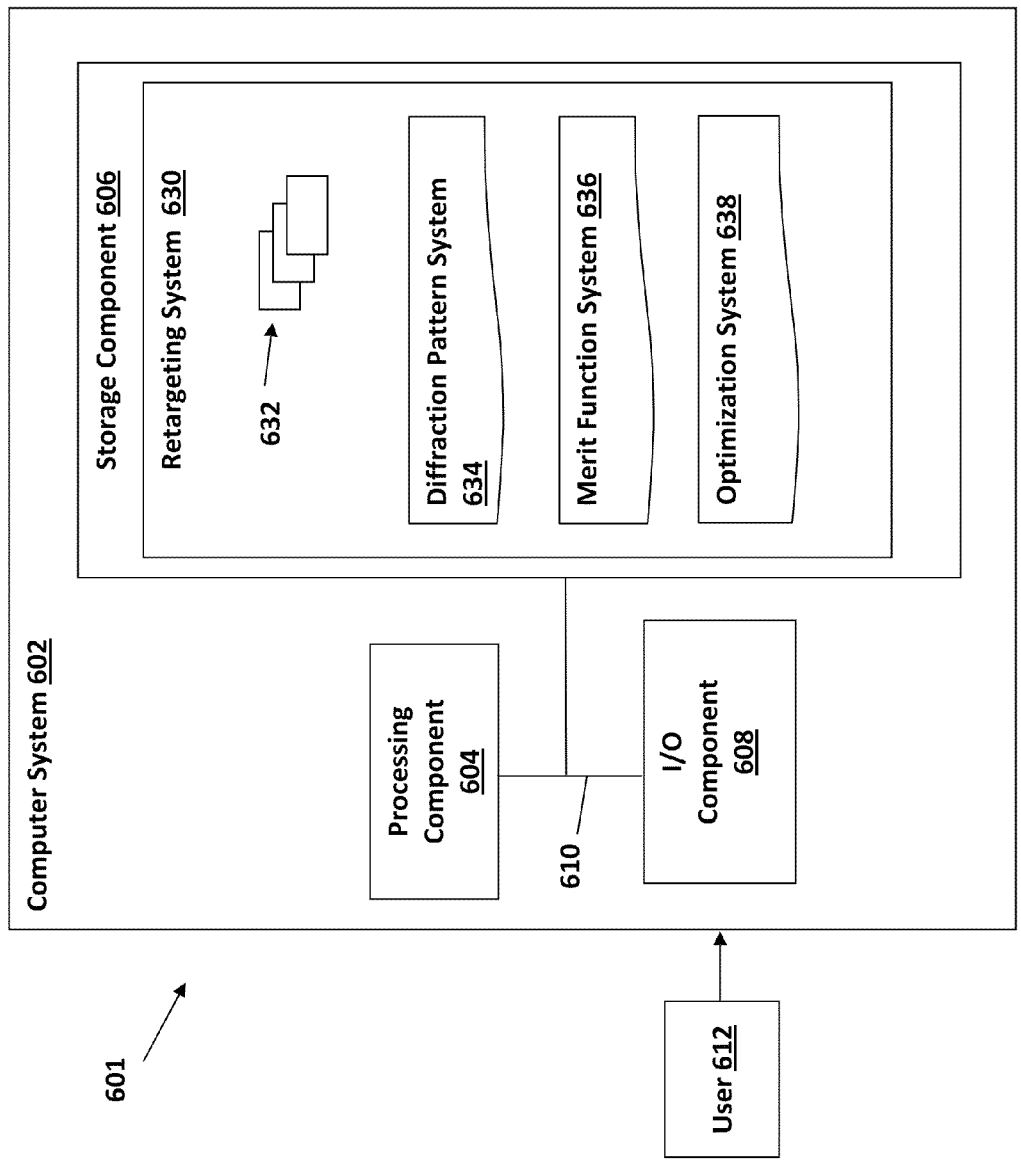
FIG. 8 is a demonstrative illustration of an environment for retargeting an integrated circuit (IC) layout according to embodiments of the invention.

FIG. 8 is a demonstrative illustration of an environment 601 for retargeting an integrated circuit (IC) layout according to embodiments. To this extent, the environment 601 includes a computer system 602 that can perform a process described herein in order to retarget target edges for features in an integrated circuit structure design. In particular, the computer system 602 is shown as including a retargeting system 630, which makes computer system 602 operable to retarget target edges for features in an integrated circuit prior to the layout design phase by performing any/all of the processes described herein and implementing any/all of the embodiments described herein. Retargeting system 630 may include a diffraction pattern system 634, a merit function system 636, and an optimization system 638.

The computer system 602 is shown including a processing component 604 (e.g., one or more processors), a storage component 606 (e.g., a storage hierarchy), an input/output (I/O) component 608 (e.g., one or more I/O interfaces and/or devices), and a communications pathway 610. In general, the processing component 604 executes program code, such as the retargeting system 630, which is at least partially fixed in the storage component 606. While executing program code, the processing component 604 can process data, which can result in reading and/or writing transformed data from/to the storage component 606 and/or the I/O component 608 for further processing. The pathway 610 provides a communications link between each of the components in the computer system 602. The I/O component 608 can comprise one or more human I/O devices, which enable a system user 612 (e.g., a technician) to interact with the computer system 602 and/or one or more communications devices to enable a system user 612 to communicate with the computer system 602 using any type of communications link. To this extent, the retargeting system 630 can manage a set of interfaces (e.g., graphical user interface(s), application program interface, etc.) that enable human and/or system users 612 to interact with the retargeting system 630. Further, the retargeting system 630 can manage (e.g., store, retrieve, create, manipulate, organize, present, etc.) data, such as random variables 642 using any solution.

In any event, the computer system 602 can comprise one or more general purpose computing articles of manufacture (e.g., computing devices) capable of executing program code, such as the retargeting system 630, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the retargeting system 630 can be embodied as any combination of system software and/or application software.

Further, the retargeting system 630 can be implemented using a set of modules 632. In this case, a module 632 can enable the computer system 602 to perform a set of tasks used by the retargeting system 630, and can be separately developed and/or implemented apart from other portions of the retargeting system 630. As used herein, the term "component" means any configuration of hardware, with or without software, which implements the functionality described in conjunction therewith using any solution, while the term "module" means program code that enables the computer system 602 to implement the functionality described in conjunction therewith using any solution. When fixed in a storage component 606 of a computer system 602 that includes a processing component 604, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 602.

When the computer system 602 comprises multiple computing devices, each computing device may have only a portion of retargeting system 630 fixed thereon (e.g., one or more modules 632). However, it is understood that the computer system 602 and retargeting system 630 are only representative of various possible equivalent computer systems that may perform a process described herein. To this extent, in other embodiments, the functionality provided by the computer system 602 and retargeting system 630 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 602 includes multiple computing devices, the computing devices can communicate over any type of communications link. Further, while performing a process described herein, the computer system 602 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 602 can obtain or provide data, such as spacing data, chip data, layout data, random variables 642 using any solution. For example, the computer system 602 can generate and/or be used to generate random variables 642, retrieve random variables 642, from one or more data stores, receive random variables 642, from another system, send random variables 642 to another system, etc.

While shown and described herein as a method and system for modeling across chip length variation of components in an integrated circuit, it is understood that aspects of the invention further provide various alternative embodiments. For example, in one embodiment, the invention provides a computer program fixed in at least one computer-readable medium, which when executed, enables a computer system to model across chip length variation of components in an integrated circuit. To this extent, the computer-readable medium includes program code, such as the retargeting system 630 (FIG. 8), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as the retargeting system 630 (FIG. 8), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method for retargeting target edges for features in an integrated circuit. In this case, a computer system, such as the computer system 602 (FIG. 8), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A computer-implemented method for retargeting an integrated circuit (IC) layout, the method comprising:
generating a diffraction pattern for the IC layout including a set of diffraction orders including first diffraction orders, the IC layout including a set of features defined by a set of target edges;
analyzing the diffraction pattern with a merit function to estimate printability of the IC layout, the merit function increasing a magnitude of the first diffraction orders;
monitoring a change in value of the merit function as a position of at least one of the set of target edges is adjusted across a range; and
retargeting the set of target edges based on the monitoring of the merit function.

2. The computer-implemented method of claim 1, wherein the generating the diffraction pattern includes taking a Fourier transform of a portion of the IC layout.

3. The computer implemented method of claim 1, wherein the monitoring the change in value of the merit function includes determining if the merit function is maximized.

4. The computer implemented method of claim 3, wherein the monitoring the change in value of the merit function further includes at least one of: retargeting the IC layout in response to a determination that the merit function is maximized or approving the IC layout for processing in response to a determination that the merit function is not maximized.

5. The computer implemented method of claim 1, wherein the monitoring the change in the value of the merit function includes determining an optimal position of the set of target edges by performing a greedy optimization on the merit function, the optimal position reducing a number of hot spot occurrences between the set of target edges.

6. The computer implemented method of claim 1, wherein the change in the merit function is defined by:

$$\Delta F\left(\frac{N}{p_{x,i}}\right) = \sum_{x=1}^{N} \Delta t(x) \exp\left[-\frac{2\pi}{N} j\left(\frac{N}{p_{x,i}} x\right)\right],$$

where ΔF is a change in the diffraction pattern, N is a size of the layout with respect to a number of pixels, px,i is an ith pitch in the layout, Δt is a movement of a target edge, and x is a target edge.

7. The computer implemented method of claim 1, wherein the generating the diffraction pattern for the IC layout includes:
dividing a two-dimensional IC layout into a set of one-dimensional IC layouts; and
analyzing each one-dimensional IC layout in the set of one-dimensional IC layouts independently.

8. The computer implemented method of claim 1, wherein the generating the diffraction pattern for the IC layout includes taking a two-dimensional Fourier transform of a portion of the IC layout.

9. The computer implemented method of claim 1, wherein the monitoring the change in value of the merit function includes at least one of: increasing a value of at least one first order variable in the diffraction pattern and sharpening a transition between a peak of the diffraction pattern and a trough of the diffraction pattern.

10. A computer system for retargeting an integrated circuit (IC) layout, the computer system comprising:
at least one computing device configured to retarget the IC layout by performing actions comprising:
generating a diffraction pattern for the IC layout including a set of first-orders, the IC layout including a set of features defined by a set of target edges;
analyzing the diffraction pattern with a merit function as a position of at least one of the set of target edges is adjusted across a range, the merit function increasing a magnitude of the set of first-orders; and
retargeting the set of target edges based on the diffraction pattern analysis.

11. The computer system of claim 10, wherein the generating the diffraction pattern includes taking a Fourier transform of a portion of the IC layout.

12. The computer system of claim 10, wherein the analyzing the diffraction pattern includes determining if the merit function is maximized and at least one of: retargeting the IC layout in response to a determination that the merit function is maximized or approving the IC layout for processing in response to a determination that the merit function is not maximized.

13. The computer system of claim 10, wherein the analyzing the diffraction pattern includes determining an optimal position of the set of target edges by performing a greedy optimization on the merit function, the optimal position reducing a number of hot spot occurrences between the set of target edges.

14. The computer system of claim 10, wherein the generating the diffraction pattern for the IC layout includes:
dividing a two-dimensional IC layout into a set of one-dimensional IC layouts; and
analyzing each one-dimensional IC layout in the set of one-dimensional IC layouts independently.

15. The computer system of claim 10, wherein the generating the diffraction pattern for the IC layout includes taking a two-dimensional Fourier transform of a portion of the IC layout.

16. The computer system of claim 10, wherein the at least one computing device is further configured to adjust the diffraction pattern following the analyzing of the diffraction pattern, the adjusting the diffraction pattern including at least one of: increasing a value of at least one first order variable in the diffraction pattern and sharpening a transition between a peak of the diffraction pattern and a trough of the diffraction pattern.

17. A computer program product comprising program code embodied in at least one computer-readable storage medium, which when executed, enables a computer system to retarget an integrated circuit (IC) layout by performing actions comprising:
generating a diffraction pattern for the IC layout including a set of first-orders, the IC layout including a set of features defined by a set of target edges;
analyzing the diffraction pattern with a merit function to estimate printability of the IC layout;
monitoring a change in value of the merit function as a position of at least one of the set of target edges is adjusted across a range, the merit function increasing a magnitude of the set of first-orders; and
retargeting the set of target edges based on the monitoring of the merit function.

18. The computer program product of claim 17, wherein the generating the diffraction pattern includes taking a Fourier transform of a portion of the IC layout.

19. The computer program product of claim 17, wherein the monitoring the change in the value of the merit function includes determining an optimal position of the set of target edges by performing a greedy optimization on the merit function, the optimal position reducing a number of hot spot occurrences between the set of target edges.

20. The computer program product of claim 17, wherein the monitoring the change in value of the merit function includes at least one of: increasing a value of at least one first order variable in the diffraction pattern and sharpening a transition between a peak of the diffraction pattern and a trough of the diffraction pattern.

\* \* \* \* \*